(12) United States Patent
Boos et al.

(10) Patent No.: US 11,956,341 B2
(45) Date of Patent: Apr. 9, 2024

(54) ELECTRONIC DEVICES HAVING ELECTRO-OPTICAL PHASE-LOCKED LOOPS

(71) Applicant: Apple Inc., Cupertino, CA (US)

(72) Inventors: Zdravko Boos, Munich (DE); Alfredo Bismuto, Sunnyvale, CA (US); Bertram R Gunzelmann, Koenigsbrunn (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/830,087

(22) Filed: Jun. 1, 2022

(65) Prior Publication Data

US 2023/0086182 A1    Mar. 23, 2023

Related U.S. Application Data

(60) Provisional application No. 63/246,747, filed on Sep. 21, 2021.

(51) Int. Cl.
*H04B 10/00* (2013.01)
*H04B 10/11* (2013.01)
*H04L 7/00* (2006.01)

(52) U.S. Cl.
CPC ............ *H04L 7/0075* (2013.01); *H04B 10/11* (2013.01)

(58) Field of Classification Search
CPC .......... H04B 10/2575; H04B 10/25753; H04B 10/11; H04B 10/611; H04B 10/6165;
(Continued)

(56) References Cited

U.S. PATENT DOCUMENTS 8,023,540 B2 * 9/2011 Kupershmidt ............ H01S 5/40
372/32
2006/0239312 A1  10/2006 Kewitsch et al.
(Continued)

FOREIGN PATENT DOCUMENTS

JP           H0567029 U     9/1993

OTHER PUBLICATIONS

K. Balakier et al., Tuneable Monolithically Integrated Photonic THz Heterodyne System, IEEE International Topical Meeting on Microwave Photonics, Sep. 2012, pp. 286-289, IEEE, New York, New York, United States.
(Continued)

*Primary Examiner* — Hanh Phan
(74) *Attorney, Agent, or Firm* — Treyz Law Group, P.C.; Michael H. Lyons

(57) ABSTRACT

An electronic device may include wireless circuitry clocked using an electro-optical phase-locked loop (OPLL) having primary and secondary lasers. A frequency-locked loop (FLL) path and a phase-locked loop (PLL) path may couple an output of the secondary laser to its input. A photodiode may generate a photodiode signal based on the laser output. A digital-to-time converter (DTC) may generate a reference signal. The FLL path may coarsely tune the secondary laser based on the photodiode signal until the secondary laser is frequency locked. Then, the PLL path may finely tune the secondary laser based on the reference signal and the photodiode signal until the phase of the secondary laser is locked to the primary laser. The photodiode signal may be subsampled on the PLL path. This may allow the OPLL to generate optical local oscillator signals with minimal jitter and phase noise.

20 Claims, 9 Drawing Sheets

(58) Field of Classification Search
CPC .. H04B 10/112; H04B 10/1123; H04B 10/40; H04B 10/2507; H04B 10/25752; H04L 7/0075
USPC ........ 398/115, 116, 117, 118, 119, 154, 155, 398/158, 159, 135, 136, 33, 38, 25, 26, 398/27, 202, 208, 209, 204, 205, 207, 398/183, 188, 130, 131, 128, 213, 195; 372/32, 38, 29.011, 29.023, 29.01
See application file for complete search history.

(56) References Cited

U.S. PATENT DOCUMENTS

| | | | |
|---|---|---|---|
| 2014/0086593 A1* | 3/2014 | Brown | H01S 3/10053 398/141 |
| 2016/0226656 A1 | 8/2016 | Okada | |
| 2019/0319356 A1* | 10/2019 | Shi | H01Q 5/22 |

OTHER PUBLICATIONS

Farshid Ashtiani et al., Towards Integrated Wideband High Resolution Optical Synthesizers, IEEE/MTT-S International Microwave Symposium, Jun. 2018, pp. 1316-1319, IEEE, New York, New York, United States.

Katarzyna Balakier et al., Monolithically integrated optical phase lock loop with 1 THz tuneability, 2017, IEEE, New York, New York, United States.

Katarzyna Balakier et al., Integrated Semiconductor Laser Optical Phase Lock Loops, IEEE Journal of Selected Topics in Quantum Electronics, 2018, vol. 24, No. 1, IEEE, New York, New York, United States.

Peter G. Goetz et al., InP-Based MMIC Components for an Optical Phase-Locked Loop, IEEE Transactions On Microwave Theory and Techniques, Jul. 1999, pp. 1241-1250, vol. 47, No. 7, IEEE, New York, New York, United States.

Santarelli et al., Heterodyne optical phase-locking of extended-cavity semiconductor lasers at 9 GHZ, Optics Communications, 1994, pp. 339-344, vol. 104, No. 4-6, Elsevier, Amsterdam, NL.

Pare-Olivier et al., Integrated Multi-wavelength Laser Source for Sensing, 2018 IEEE 68th Electronic Components and Technology Conference (ECTC), 2018, pp. 859-864, IEEE, New York, NY, United States.

* cited by examiner

ELECTRONIC DEVICES HAVING ELECTRO-OPTICAL PHASE-LOCKED LOOPS

This application claims the benefit of U.S. Provisional Patent Application No. 63/246,747, filed Sep. 21, 2021, which is hereby incorporated by reference herein in its entirety.

FIELD

This disclosure relates generally to electronic devices and, more particularly, to electronic devices with wireless circuitry.

BACKGROUND

Electronic devices can be provided with wireless capabilities. An electronic device with wireless capabilities has wireless circuitry that includes one or more antennas. The wireless circuitry is used to perform communications using radio-frequency signals conveyed by the antennas.

As software applications on electronic devices become more data-intensive over time, demand has grown for electronic devices that support wireless communications at higher data rates. However, the maximum data rate supported by electronic devices is limited by the frequency of the radio-frequency signals. As communication frequencies increase, it can become difficult to provide low jitter and low phase noise clocking for the wireless circuitry.

SUMMARY

An electronic device may include wireless circuitry that conveys wireless signals at frequencies greater than 100 GHz. The wireless circuitry or other circuitry in the device may be clocked using an electro-optical phase-locked loop (OPLL). The OPLL may include a primary laser that emits a first optical local oscillator (LO) signal at a fixed first frequency and a secondary laser that emits a second optical LO signal at an adjustable second frequency. The wireless circuitry may, for example, convey the wireless signals using the first and second optical LO signals.

A frequency-locked loop (FLL) path and a phase-locked loop (PLL) path may couple an output of the secondary laser to an input of the secondary laser. A photodiode may be interposed on both the FLL path and the PLL path. The photodiode may generate a photodiode signal based on the first and second optical LO signals. The OPLL may include a reference oscillator that generates a reference oscillator signal. The OPLL may include a digital-to-time converter (DTC) that generates a DTC reference signal based on the oscillator signal.

The FLL path may coarsely tune the secondary laser based on the reference oscillator signal and the photodiode signal. For example, the FLL path may include a counter that estimates a frequency offset between the first and second optical LO signals. The counter may coarsely tune the secondary laser based on the estimated frequency offset (e.g., until the frequency of the second optical LO signal settles and is locked to a predetermined value). Once the frequency of the second optical LO signal is locked, the PLL path may finely tune the secondary laser based on the DTC reference signal and the photodiode signal. For example, the PLL path may include a subsampling mixer that subsamples the photodiode signal to produce a subsampled photodiode signal. The subsampling mixer may finely tune the secondary laser based on a phase difference between the DTC reference signal and the subsampled photodiode signal (e.g., until the phase of the second optical LO signal settles and is locked with respect to the first optical LO signal). In this way, the first and second optical LO signals may be used to clock portions of device 10 with minimal jitter and phase noise.

An aspect of the disclosure provides an electro-optical phase-locked loop. The electro-optical phase-locked loop can include a first light source configured to emit light at a first frequency. The electro-optical phase-locked loop can include a second light source configured to emit light at a second frequency that is offset from the first frequency by an offset frequency of at least 50 GHz. The electro-optical phase-locked loop can include a feedback path that communicably couples an output of the second light source to an input of the second light source. The electro-optical phase-locked loop can include a digital-to-time converter (DTC) configured to generate a reference signal. The electro-optical phase-locked loop can include a phase comparator interposed along the feedback path, wherein the phase comparator is configured to adjust the second light source based at least in part on the reference signal.

An aspect of the disclosure provides a method of operating an electro-optical phase-locked loop. The method can include with a first laser, emitting a first optical local oscillator (LO) signal at a first frequency. The method can include with a second laser, emitting a second optical LO signal at a second frequency that is offset from the first frequency by an offset frequency greater than 50 GHz. The method can include with a frequency-locked loop (FLL) path communicably coupled between an output of the second laser and an input of the second laser, coarsely tuning the second optical LO signal emitted by the second laser until the second frequency is locked. The method can include once the second frequency is locked, with a phase-locked loop (PLL) path communicably coupled between the output of the second laser and the input of the second laser, finely tuning the second optical LO signal emitted by the second laser until the second optical LO signal is phase-locked with the first optical LO signal.

An aspect of the disclosure provides an electronic device. The electronic device can include an antenna radiating element. The electronic device can include a photodiode coupled to the antenna radiating element and configured to convey wireless signals at a frequency greater than 100 GHz using the antenna radiating element, a first optical local oscillator (LO) signal, and a second optical LO signal. The electronic device can include optical components configured to generate the first optical LO signal and the second optical LO signal. The optical components can include a first laser configured to emit the first optical LO signal. The optical components can include a second laser configured to emit the second optical LO signal. The optical components can include a photodiode configured to generate a photodiode signal based on the first optical LO signal and the second optical LO signal. The optical components can include a subsampling mixer configured to generate a subsampled photodiode signal based on the photodiode signal and configured to tune the second laser based at least in part on a phase of the subsampled photodiode signal.

DETAILED DESCRIPTION

Figure 1:
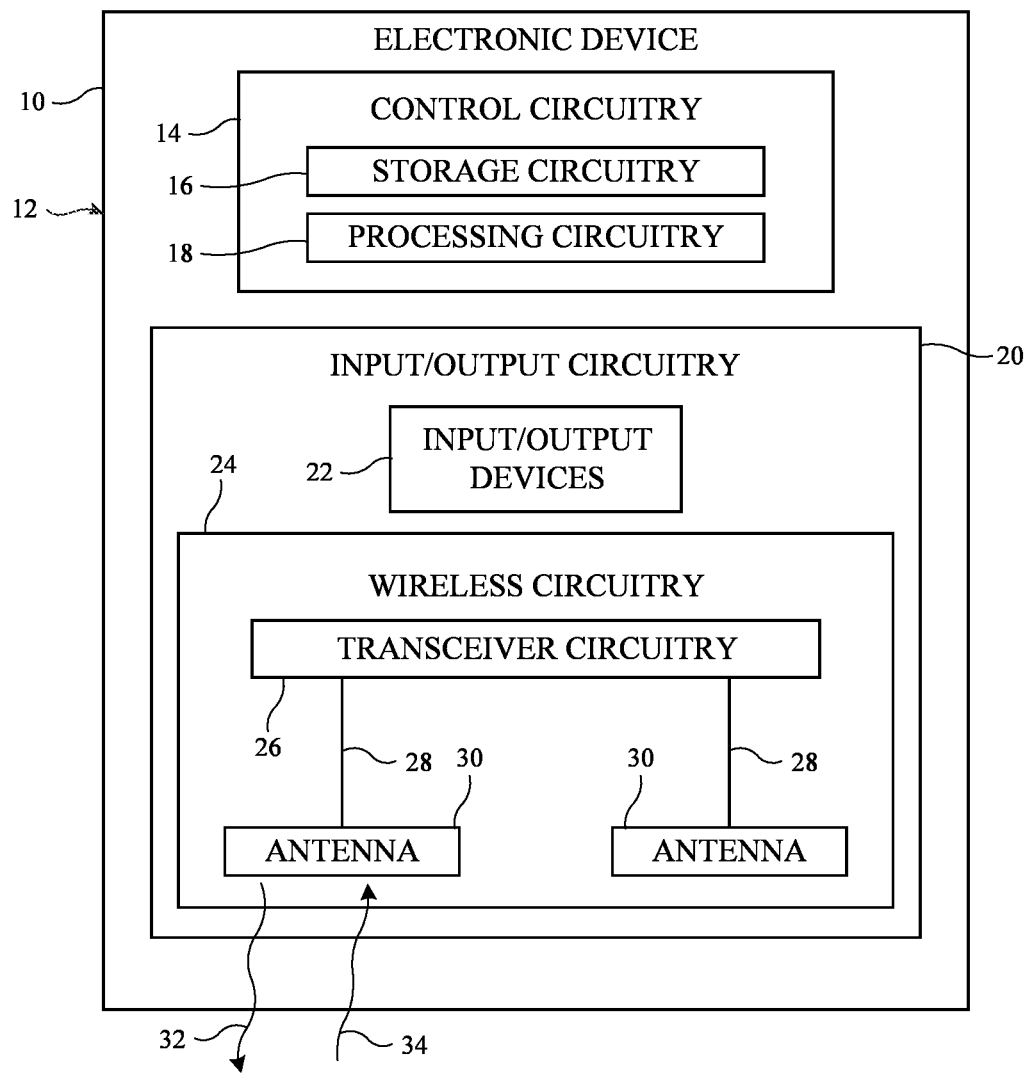
FIG. 1 is a block diagram of an illustrative electronic device having wireless circuitry with at least one antenna that conveys wireless signals at frequencies greater than about 100 GHz in accordance with some embodiments.

Electronic device 10 of FIG. 1 (sometimes referred to herein as electro-optical device 10) may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses, goggles, or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors, microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), temperature sensors, etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas 30. Wireless circuitry 24 may also include transceiver circuitry 26. Transceiver circuitry 26 may include transmitter circuitry, receiver circuitry, modulator circuitry, demodulator circuitry (e.g., one or more modems), radio-frequency circuitry, one or more radios, intermediate frequency circuitry, optical transmitter circuitry, optical receiver circuitry, optical light sources, other optical components, baseband circuitry (e.g., one or more baseband processors), amplifier circuitry, clocking circuitry such as one or more local oscillators and/or phase-locked loops, memory, one or more registers, filter circuitry, switching circuitry, analog-to-digital converter (ADC) circuitry, digital-to-analog converter (DAC) circuitry, radio-frequency transmission lines, optical fibers, and/or any other circuitry for transmitting and/or receiving wireless signals using antennas 30. The components of transceiver circuitry 26 may be implemented on one integrated circuit, chip, system-on-chip (SOC), die, printed circuit board, substrate, or package, or the components of transceiver circuitry 26 may be distributed across two or more integrated circuits, chips, SOCs, printed circuit boards, substrates, and/or packages.

The example of FIG. 1 is merely illustrative. While control circuitry 14 is shown separately from wireless circuitry 24 in the example of FIG. 1 for the sake of clarity, wireless circuitry 24 may include processing circuitry (e.g., one or more processors) that forms a part of processing circuitry 18 and/or storage circuitry that forms a part of storage circuitry 16 of control circuitry 14 (e.g., portions of control circuitry 14 may be implemented on wireless circuitry 24). As an example, control circuitry 14 may include baseband circuitry (e.g., one or more baseband processors), digital control circuitry, analog control circuitry, and/or other control circuitry that forms part of wireless circuitry 24. The baseband circuitry may, for example, access a communication protocol stack on control circuitry 14 (e.g., storage circuitry 20) to: perform user plane functions at a PHY layer, MAC layer, RLC layer, PDCP layer, SDAP layer, and/or PDU layer, and/or to perform control plane functions at the PHY layer, MAC layer, RLC layer, PDCP layer, RRC, layer, and/or non-access stratum layer.

Transceiver circuitry 26 may be coupled to each antenna 30 in wireless circuitry 24 over a respective signal path 28. Each signal path 28 may include one or more radio-frequency transmission lines, waveguides, optical fibers, and/or any other desired lines/paths for conveying wireless signals between transceiver circuitry 26 and antenna 30. Antennas 30 may be formed using any desired antenna structures for conveying wireless signals. For example, antennas 30 may include antennas with resonating elements that are formed from dipole antenna structures, planar dipole antenna structures (e.g., bowtie antenna structures), slot antenna structures, loop antenna structures, patch antenna structures, inverted-F antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antennas 30 over time.

If desired, two or more of antennas 30 may be integrated into a phased antenna array (sometimes referred to herein as a phased array antenna) in which each of the antennas conveys wireless signals with a respective phase and magnitude that is adjusted over time so the wireless signals constructively and destructively interfere to produce (form) a signal beam in a given pointing direction. The term "convey wireless signals" as used herein means the transmission and/or reception of the wireless signals (e.g., for performing unidirectional and/or bidirectional wireless communications with external wireless communications equipment). Antennas 30 may transmit the wireless signals by radiating the signals into free space (or to free space through intervening device structures such as a dielectric cover layer). Antennas 30 may additionally or alternatively receive the wireless signals from free space (e.g., through intervening devices structures such as a dielectric cover layer). The transmission and reception of wireless signals by antennas 30 each involve the excitation or resonance of antenna currents on an antenna resonating (radiating) element in the antenna by the wireless signals within the frequency band(s) of operation of the antenna.

Transceiver circuitry 26 may use antenna(s) 30 to transmit and/or receive wireless signals that convey wireless communications data between device 10 and external wireless communications equipment (e.g., one or more other devices such as device 10, a wireless access point or base station, etc.). The wireless communications data may be conveyed bidirectionally or unidirectionally. The wireless communications data may, for example, include data that has been encoded into corresponding data packets such as wireless data associated with a telephone call, streaming media content, internet browsing, wireless data associated with software applications running on device 10, email messages, etc.

Additionally or alternatively, wireless circuitry 24 may use antenna(s) 30 to perform wireless sensing operations. The sensing operations may allow device 10 to detect (e.g., sense or identify) the presence, location, orientation, and/or velocity (motion) of objects external to device 10. Control circuitry 14 may use the detected presence, location, orientation, and/or velocity of the external objects to perform any desired device operations. As examples, control circuitry 14 may use the detected presence, location, orientation, and/or velocity of the external objects to identify a corresponding user input for one or more software applications running on device 10 such as a gesture input performed by the user's hand(s) or other body parts or performed by an external stylus, gaming controller, head-mounted device, or other peripheral devices or accessories, to determine when one or more antennas 30 needs to be disabled or provided with a reduced maximum transmit power level (e.g., for satisfying regulatory limits on radio-frequency exposure), to determine how to steer (form) a radio-frequency signal beam produced by antennas 30 for wireless circuitry 24 (e.g., in scenarios where antennas 30 include a phased array of antennas 30), to map or model the environment around device 10 (e.g., to produce a software model of the room where device 10 is located for use by an augmented reality application, gaming application, map application, home design application, engineering application, etc.), to detect the presence of obstacles in the vicinity of (e.g., around) device 10 or in the direction of motion of the user of device 10, etc.

Wireless circuitry 24 may transmit and/or receive wireless signals within corresponding frequency bands of the electromagnetic spectrum (sometimes referred to herein as communications bands or simply as "bands"). The frequency bands handled by communications circuitry 26 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Over time, software applications on electronic devices such as device 10 have become more and more data intensive. Wireless circuitry on the electronic devices therefore needs to support data transfer at higher and higher data rates. In general, the data rates supported by the wireless circuitry are proportional to the frequency of the wireless signals conveyed by the wireless circuitry (e.g., higher frequencies can support higher data rates than lower frequencies). Wireless circuitry 24 may convey centimeter and millimeter wave signals to support relatively high data rates (e.g., because centimeter and millimeter wave signals are at relatively high frequencies between around 10 GHz and 100 GHz). However, the data rates supported by centimeter and millimeter wave signals may still be insufficient to meet all the data transfer needs of device 10. To support even higher data rates such as data rates up to 5-10 Gbps or higher, wireless circuitry 24 may convey wireless signals at frequencies greater than 100 GHz.

As shown in FIG. 1, wireless circuitry 24 may transmit wireless signals 32 and may receive wireless signals 34 at frequencies greater than around 100 GHz. Wireless signals 32 and 34 may sometimes be referred to herein as tremendously high frequency (THF) signals 32 and 34, sub-THz signals 32 and 34, THz signals 32 and 34, or sub-millimeter wave signals 32 and 34. THF signals 32 and 34 may be at sub-THz or THz frequencies such as frequencies between 100 GHz and 1 THz, between 100 GHz and 10 THz, between 100 GHz and 2 THz, between 200 GHz and 1 THz, between 300 GHz and 1 THz, between 300 GHz and 2 THz, between 300 GHz and 10 THz, between 100 GHz and 800 GHz, between 200 GHz and 1.5 THz, etc. (e.g., within a sub-THz, THz, THF, or sub-millimeter frequency band such as a 6G frequency band). The high data rates supported by these frequencies may be leveraged by device 10 to perform cellular telephone voice and/or data communications (e.g., while supporting spatial multiplexing to provide further data bandwidth), to perform spatial ranging operations such as radar operations to detect the presence, location, and/or velocity of objects external to device 10, to perform automotive sensing (e.g., with enhanced security), to perform health/body monitoring on a user of device 10 or another person, to perform gas or chemical detection, to form a high data rate wireless connection between device 10 and another device or peripheral device (e.g., to form a high data rate connection between a display driver on device 10 and a display that displays ultra-high resolution video), to form a remote radio head (e.g., a flexible high data rate connection), to form a THF chip-to-chip connection within device 10 that supports high data rates (e.g., where one antenna 30 on a first chip in device 10 transmits THF signals 32 to another antenna 30 on a second chip in device 10), and/or to perform any other desired high data rate operations.

Space is at a premium within electronic devices such as device 10. In some scenarios, different antennas 30 are used to transmit THF signals 32 than are used to receive THF signals 34. However, handling transmission of THF signals 32 and reception of THF signals 34 using different antennas 30 can consume an excessive amount of space and other resources within device 10 because two antennas 30 and signal paths 28 would be required to handle both transmission and reception. To minimize space and resource consumption within device 10, the same antenna 30 and signal path 28 may be used to both transmit THF signals 32 and to receive THF signals 34. If desired, multiple antennas 30 in wireless circuitry 24 may transmit THF signals 32 and may receive THF signals 34. The antennas may be integrated into a phased antenna array that transmits THF signals 32 and that receives THF signals 34 within a corresponding signal beam oriented in a selected beam pointing direction.

It can be challenging to incorporate components into wireless circuitry 24 that support wireless communications at these high frequencies. If desired, transceiver circuitry 26 and signal paths 28 may include optical components that convey optical signals to support the transmission of THF signals 32 and the reception of THF signals 34 in a space and resource-efficient manner. The optical signals may be used in transmitting THF signals 32 at THF frequencies and in receiving THF signals 34 at THF frequencies.

Figure 2:
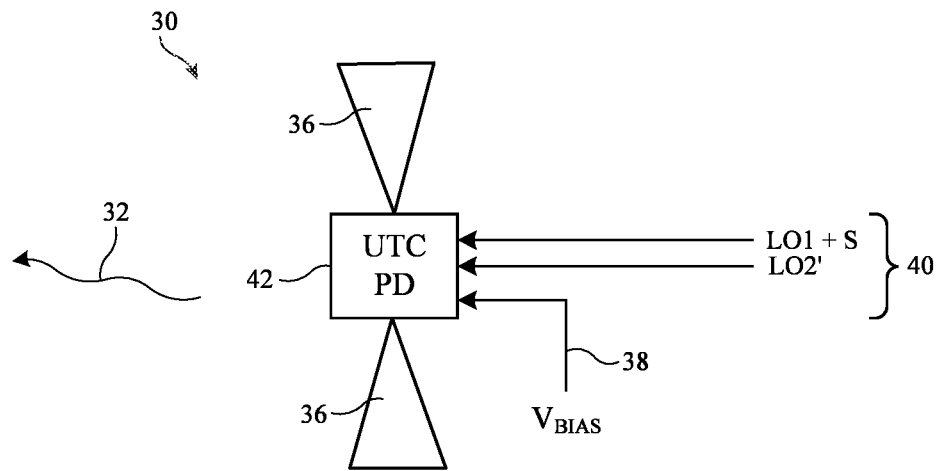
FIG. 2 is a top view of an illustrative antenna that transmits wireless signals at frequencies greater than about 100 GHz based on optical local oscillator (LO) signals in accordance with some embodiments.

FIG. 2 is a diagram of an illustrative antenna 30 that may be used to both transmit THF signals 32 and to receive THF signals 34 using optical signals. Antenna 30 may include one or more antenna radiating (resonating) elements such as radiating (resonating) element arms 36. In the example of FIG. 2, antenna 30 is a planar dipole antenna (sometimes referred to as a "bowtie" antenna) having two opposing radiating element arms 36 (e.g., bowtie arms or dipole arms). This is merely illustrative and, in general, antenna 30 may be any type of antenna having any desired antenna radiating element architecture.

As shown in FIG. 2, antenna 30 includes a photodiode (PD) 42 coupled between radiating element arms 36. Electronic devices that include antennas 30 with photodiodes 42 such as device 10 may sometimes also be referred to as electro-optical devices (e.g., electro-optical device 10). Photodiode 42 may be a programmable photodiode. An example in which photodiode 42 is a programmable uni-travelling-carrier photodiode (UTC PD) is described herein as an example. Photodiode 42 may therefore sometimes be referred to herein as UTC PD 42 or programmable UTC PD 42. This is merely illustrative and, in general, photodiode 42 may include any desired type of adjustable/programmable photodiode or component that converts electromagnetic energy (e.g., light or light energy) at optical frequencies (e.g., infrared, visible, and/or ultraviolet frequencies) to current at THF frequencies on radiating element arms 36 and/or vice versa. Each radiating element arm 36 may, for example, have a first edge at UTC PD 42 and a second edge opposite the first edge that is wider than the first edge (e.g., in implementations where antenna 30 is a bowtie antenna). Other radiating elements may be used if desired.

UTC PD 42 may have a bias terminal 38 that receives one or more control signals $V_{BIAS}$. Control signals $V_{BIAS}$ may include bias voltages provided at one or more voltage levels and/or other control signals for controlling the operation of UTC PD 42 such as impedance adjustment control signals for adjusting the output impedance of UTC PD 42. Control circuitry 14 (FIG. 1) may provide (e.g., apply, supply, assert, etc.) control signals $V_{BIAS}$ at different settings (e.g., values, magnitudes, etc.) to dynamically control (e.g., program or adjust) the operation of UTC PD 42 over time. For example, control signals $V_{BIAS}$ may be used to control whether antenna 30 transmits THF signals 32 or receives THF signals 34. When control signals $V_{BIAS}$ include a bias voltage asserted at a first level or magnitude, antenna 30 may be configured to transmit THF signals 32. When control signals $V_{BIAS}$ include a bias voltage asserted at a second level or magnitude, antenna 30 may be configured to receive THF signals 34. In the example of FIG. 2, control signals $V_{BIAS}$ include the bias voltage asserted at the first level to configure antenna 30 to transmit THF signals 32. If desired, control signals $V_{BIAS}$ may also be adjusted to control the waveform of the THF signals (e.g., as a squaring function that preserves the modulation of incident optical signals, a linear function, etc.), to perform gain control on the signals conveyed by antenna 30, and/or to adjust the output impedance of UTC PD 42.

As shown in FIG. 2, UTC PD 42 may be optically coupled to optical path 40. Optical path 40 may include one or more optical fibers or waveguides. UTC PD 42 may receive optical signals from transceiver circuitry 26 (FIG. 1) over optical path 40. The optical signals may include a first optical local oscillator (LO) signal LO1 and a second optical local oscillator signal LO2. Optical local oscillator signals LO1 and LO2 may be generated by light sources in transceiver circuitry 26 (FIG. 1). Optical local oscillator signals LO1 and LO2 may be at optical wavelengths (e.g., between 400 nm and 700 nm), ultra-violet wavelengths (e.g., near-ultra-violet or extreme ultraviolet wavelengths), and/or infrared wavelengths (e.g., near-infrared wavelengths, mid-infrared wavelengths, or far-infrared wavelengths). Optical local oscillator signal LO2 may be offset in wavelength from optical local oscillator signal LO1 by a wavelength offset X. Wavelength offset X may be equal to the wavelength of the THF signals conveyed by antenna 30 (e.g., between 100 GHz and 1 THz (1000 GHz), between 100 GHz and 2 THz, between 300 GHz and 800 GHz, between 300 GHz and 1 THz, between 300 and 400 GHz, etc.).

During signal transmission, wireless data (e.g., wireless data packets, symbols, frames, etc.) may be modulated onto optical local oscillator signal LO2 to produce modulated optical local oscillator signal LO2'. If desired, optical local oscillator signal LO1 may be provided with an optical phase shift S. Optical path 40 may illuminate UTC PD 42 with optical local oscillator signal LO1 (plus the optical phase shift S when applied) and modulated optical local oscillator signal LO2'. If desired, lenses or other optical components may be interposed between optical path 40 and UTC PD 42 to help focus the optical local oscillator signals onto UTC PD 42.

UTC PD 42 may convert optical local oscillator signal LO1 and modulated local oscillator signal LO2' (e.g., beats between the two optical local oscillator signals) into antenna currents that run along the perimeter of radiating element arms 36. The frequency of the antenna currents is equal to the frequency difference between local oscillator signal LO1 and modulated local oscillator signal LO2'. The antenna currents may radiate (transmit) THF signals 32 into free space. Control signal $V_{BIAS}$ may control UTC PD 42 to convert the optical local oscillator signals into antenna currents on radiating element arms 36 while preserving the modulation and thus the wireless data on modulated local oscillator signal LO2' (e.g., by applying a squaring function to the signals). THF signals 32 will thereby carry the modulated wireless data for reception and demodulation by external wireless communications equipment.

Figure 3:
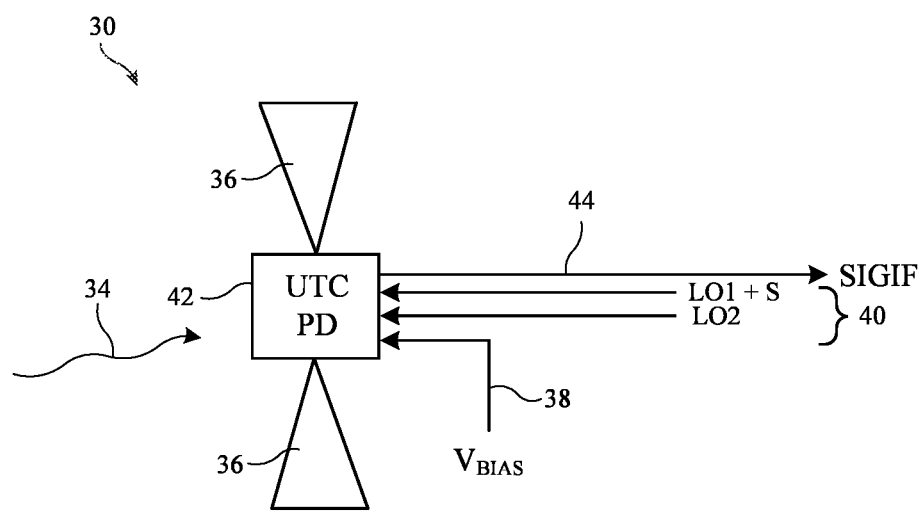
FIG. 3 is a top view showing how an illustrative antenna of the type shown in FIG. 2 may convert received wireless signals at frequencies greater than about 100 GHz into intermediate frequency signals based on optical LO signals in accordance with some embodiments.

FIG. 3 is a diagram showing how antenna 30 may receive THF signals 34 (e.g., after changing the setting of control signals $V_{BIAS}$ into a reception state from the transmission state of FIG. 2). As shown in FIG. 3, THF signals 34 may be incident upon antenna radiating element arms 36. The incident THF signals 34 may produce antenna currents that flow around the perimeter of radiating element arms 36. UTC PD 42 may use optical local oscillator signal LO1 (plus the optical phase shift S when applied), optical local oscillator signal LO2 (e.g., without modulation), and control signals $V_{BIAS}$ (e.g., a bias voltage asserted at the second level) to convert the received THF signals 34 into intermediate frequency signals SIGIF that are output onto intermediate frequency signal path 44.

The frequency of intermediate frequency signals SIGIF may be equal to the frequency of THF signals 34 minus the difference between the frequency of optical local oscillator signal LO1 and the frequency of optical local oscillator signal LO2. As an example, intermediate frequency signals SIGIF may be at lower frequencies than THF signals 32 and 34 such as centimeter or millimeter wave frequencies between 10 GHz and 100 GHz, between 30 GHz and 80 GHz, around 60 GHz, etc. If desired, transceiver circuitry 26 (FIG. 1) may change the frequency of optical local oscillator signal LO1 and/or optical local oscillator signal LO2 when switching from transmission to reception or vice versa. UTC PD 42 may preserve the data modulation of THF signals 34 in intermediate signals SIGIF. A receiver in transceiver circuitry 26 (FIG. 1) may demodulate intermediate frequency signals SIGIF (e.g., after further down conversion) to recover the wireless data from THF signals 34. In another example, wireless circuitry 24 may convert intermediate frequency signals SIGIF to the optical domain before recovering the wireless data. In yet another example, intermediate frequency signal path 44 may be omitted and UTC PD 42 may convert THF signals 34 into the optical domain for subsequent demodulation and data recovery (e.g., in a sideband of the optical signal).

Figure 4:
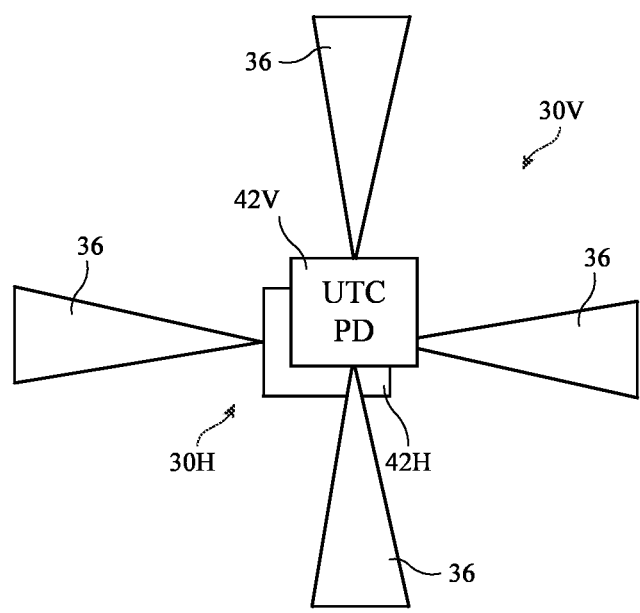
FIG. 4 is a top view showing how multiple antennas of the type shown in FIGS. 2 and 3 may be stacked to cover multiple polarizations in accordance with some embodiments.

The antenna 30 of FIGS. 2 and 3 may support transmission of THF signals 32 and reception of THF signals 34 with a given polarization (e.g., a linear polarization such as a vertical polarization). If desired, wireless circuitry 24 (FIG. 1) may include multiple antennas 30 for covering different polarizations. FIG. 4 is a diagram showing one example of how wireless circuitry 24 may include multiple antennas 30 for covering different polarizations.

As shown in FIG. 4, the wireless circuitry may include a first antenna 30 such as antenna 30V for covering a first polarization (e.g., a first linear polarization such as a vertical polarization) and may include a second antenna 30 such as antenna 30H for covering a second polarization different from or orthogonal to the first polarization (e.g., a second linear polarization such as a horizontal polarization). Antenna 30V may have a UTC PD 42 such as UTC PD 42V coupled between a corresponding pair of radiating element arms 36. Antenna 30H may have a UTC PD 42 such as UTC PD 42H coupled between a corresponding pair of radiating element arms 36 oriented non-parallel (e.g., orthogonal) to the radiating element arms 36 in antenna 30V. This may allow antennas 30V and 30H to transmit THF signals 32 with respective (orthogonal) polarizations and may allow antennas 30V and 30H to receive THF signals 32 with respective (orthogonal) polarizations.

To minimize space within device 10, antenna 30V may be vertically stacked over or under antenna 30H (e.g., where UTC PD 42V partially or completely overlaps UTC PD 42H). In this example, antennas 30V and 30H may both be formed on the same substrate such as a rigid or flexible printed circuit board. The substrate may include multiple stacked dielectric layers (e.g., layers of ceramic, epoxy, flexible printed circuit board material, rigid printed circuit board material, etc.). The radiating element arms 36 in antenna 30V may be formed on a separate layer of the substrate than the radiating element arms 36 in antenna 30H or the radiating element arms 36 in antenna 30V may be formed on the same layer of the substrate as the radiating element arms 36 in antenna 30H. UTC PD 42V may be formed on the same layer of the substrate as UTC PD 42H or UTC PD 42V may be formed on a separate layer of the substrate than UTC PD 42H. UTC PD 42V may be formed on the same layer of the substrate as the radiating element arms 36 in antenna 30V or may be formed on a separate layer of the substrate as the radiating element arms 36 in antenna 30V. UTC PD 42H may be formed on the same layer of the substrate as the radiating element arms 36 in antenna 30H or may be formed on a separate layer of the substrate as the radiating element arms 36 in antenna 30H.

Figure 5:
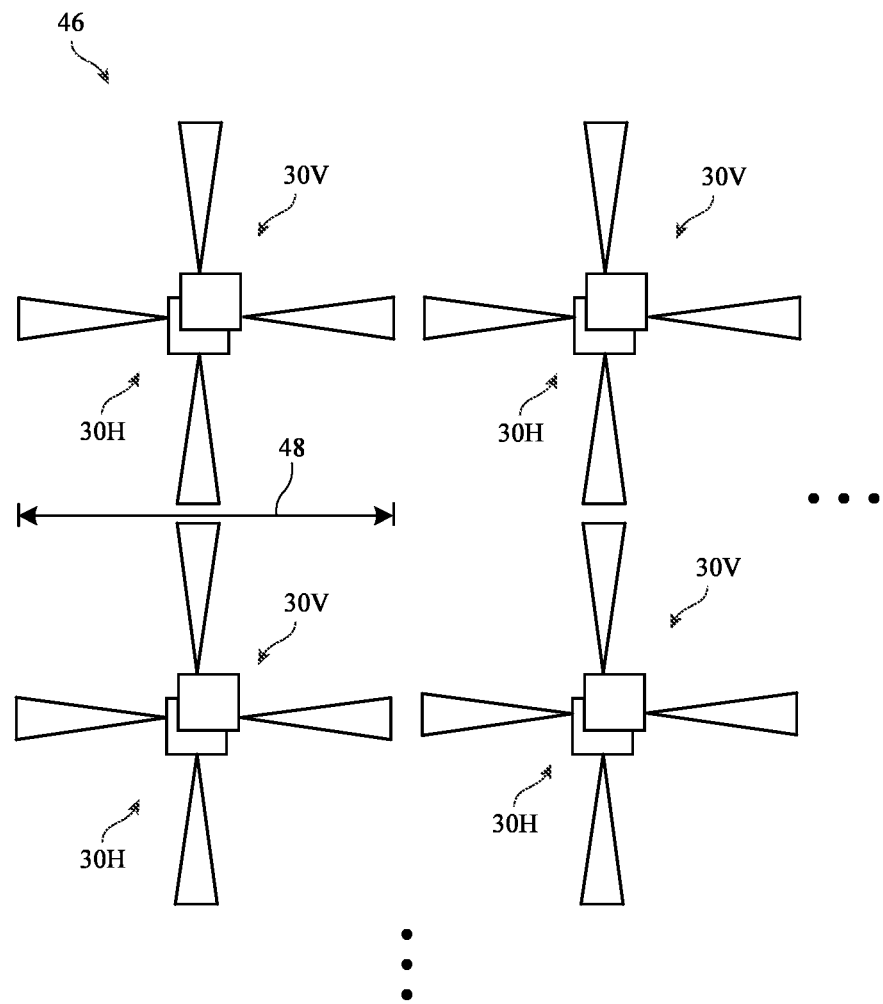
FIG. 5 is a top view showing how stacked antennas of the type shown in FIG. 4 may be integrated into a phased antenna array for conveying wireless signals at frequencies greater than about 100 GHz within a corresponding signal beam.

If desired, antennas 30 or antennas 30H and 30V of FIG. 4 may be integrated within a phased antenna array. FIG. 5 is a diagram showing one example of how antennas 30H and 30V may be integrated within a phased antenna array. As shown in FIG. 5, device 10 may include a phased antenna array 46 of stacked antennas 30H and 30V arranged in a rectangular grid of rows and columns. Each of the antennas in phased antenna array 46 may be formed on the same substrate. This is merely illustrative. In general, phased antenna array 46 (sometimes referred to as a phased array antenna) may include any desired number of antennas 30V and 30H (or non-stacked antennas 30) arranged in any desired pattern. Each of the antennas in phased antenna array 46 may be provided with a respective optical phase shift S (FIGS. 2 and 3) that configures the antennas to collectively transmit THF signals 32 and/or receive THF signals 34 that sum to form a signal beam of THF signals in a desired beam pointing direction. The beam pointing direction may be selected to point the signal beam towards external communications equipment, towards a desired external object, away from an external object, etc.

Phased antenna array 46 may occupy relatively little space within device 10. For example, each antenna 30V/30H may have a length 48 (e.g., as measured from the end of one radiating element arm to the opposing end of the opposite radiating element arm). Length 48 may be approximately equal to one-half the wavelength of THF signals 32 and 34. For example, length 48 may be as small as 0.5 mm or less. Each UTC-PD 42 in phased antenna array 46 may occupy a lateral area of 100 square microns or less. This may allow phased antenna array 46 to occupy very little area within device 10, thereby allowing the phased antenna array to be integrated within different portions of device 10 while still allowing other space for device components. The examples of FIGS. 2-5 are merely illustrative and, in general, each antenna may have any desired antenna radiating element architecture.

Figure 6:
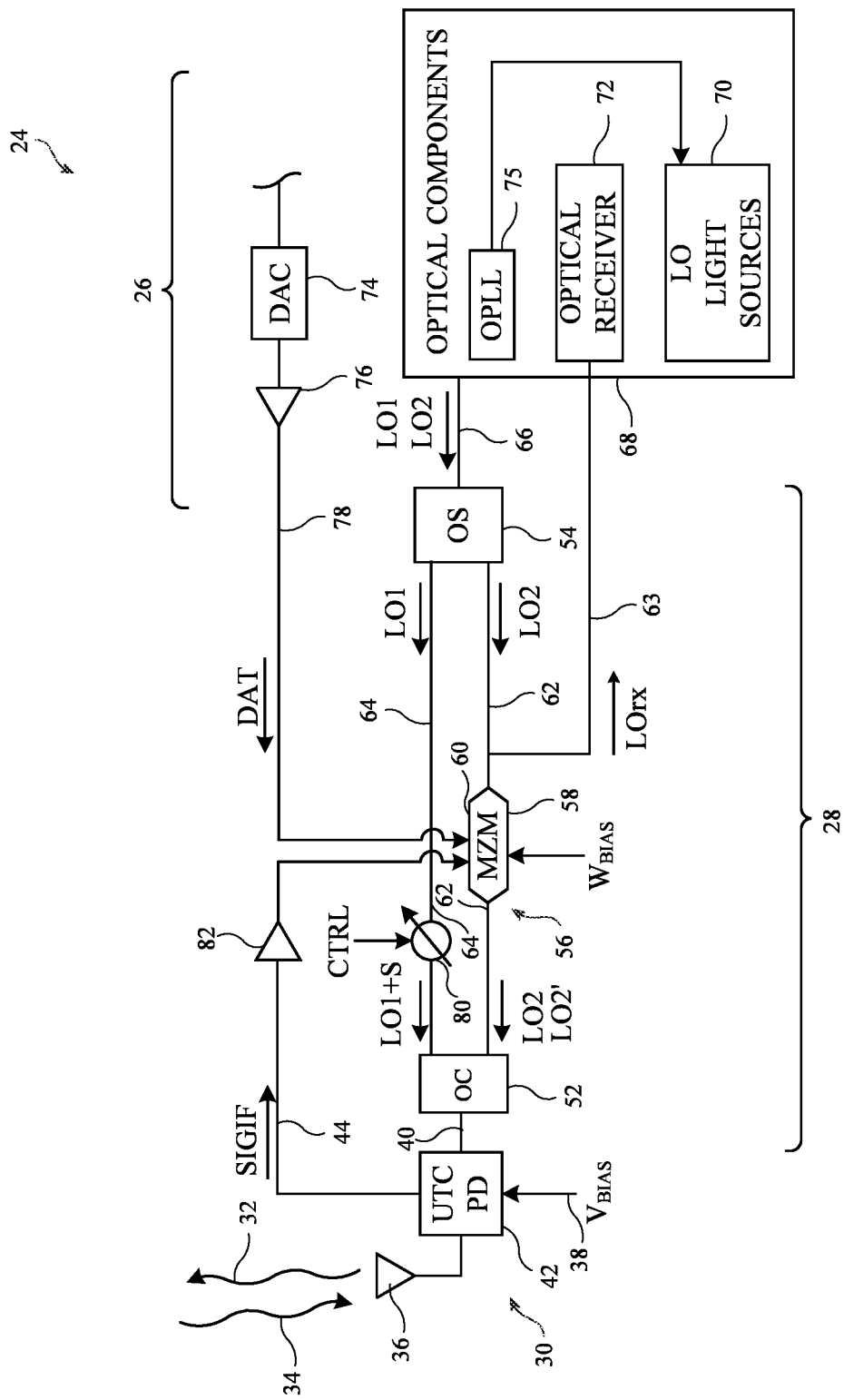
FIG. 6 is a circuit diagram of illustrative wireless circuitry having an antenna that transmits wireless signals at frequencies greater than about 100 GHz and that receives wireless signals at frequencies greater than about 100 GHz for conversion to intermediate frequencies and then to the optical domain in accordance with some embodiments.

FIG. 6 is a circuit diagram showing how a given antenna 30 and signal path 28 (FIG. 1) may be used to both transmit THF signals 32 and receive THF signals 34 based on optical local oscillator signals. In the example of FIG. 6, UTC PD 42 converts received THF signals 34 into intermediate frequency signals SIGIF that are then converted to the optical domain for recovering the wireless data from the received THF signals.

As shown in FIG. 6, wireless circuitry 24 may include transceiver circuitry 26 coupled to antenna 30 over signal path 28 (e.g., an optical signal path sometimes referred to herein as optical signal path 28). UTC PD 42 may be coupled between the radiating element arm(s) 36 of antenna 30 and signal path 28. Transceiver circuitry 26 may include optical components 68, amplifier circuitry such as power amplifier 76, and digital-to-analog converter (DAC) 74. Optical components 68 may include an optical receiver such as optical receiver 72 and optical local oscillator (LO) light sources (emitters) 70. LO light sources 70 may include two or more light sources (e.g., sources of electromagnetic energy, light, or light energy) such as laser light sources, laser diodes, optical phase locked loops, or other optical emitters that emit light (e.g., electromagnetic energy, light, or light energy that includes optical local oscillator signals LO1 and LO2) at respective wavelengths (e.g., visible, infrared, and/or ultraviolet wavelengths). If desired, LO light sources 70 may include a single light source and may include optical components for splitting the light emitted by the light source into different wavelengths. Signal path 28 may be coupled to optical components 68 over optical path 66. Optical path 66 may include one or more optical fibers and/or waveguides.

Signal path 28 may include an optical splitter such as optical splitter (OS) 54, optical paths such as optical path 64 and optical path 62, an optical combiner such as optical combiner (OC) 52, and optical path 40. Optical path 62 may be an optical fiber or waveguide. Optical path 64 may be an optical fiber or waveguide. Optical splitter 54 may have a first (e.g., input) port coupled to optical path 66, a second (e.g., output) port coupled to optical path 62, and a third (e.g., output) port coupled to optical path 64. Optical path 64 may couple optical splitter 54 to a first (e.g., input) port of optical combiner 52. Optical path 62 may couple optical splitter 54 to a second (e.g., input) port of optical combiner 52. Optical combiner 52 may have a third (e.g., output) port coupled to optical path 40.

An optical phase shifter such as optical phase shifter 80 may be (optically) interposed on or along optical path 64. An optical modulator such as optical modulator 56 may be (optically) interposed on or along optical path 62. Optical modulator 56 may be, for example, a Mach-Zehnder modulator (MZM) and may therefore sometimes be referred to herein as MZM 56. MZM 56 includes a first optical arm (branch) 60 and a second optical arm (branch) 58 interposed in parallel along optical path 62. Propagating optical local oscillator signal LO2 along arms 60 and 58 of MZM 56 may, in the presence of a voltage signal applied to one or both arms, allow different optical phase shifts to be imparted on each arm before recombining the signal at the output of the MZM (e.g., where optical phase modulations produced on the arms are converted to intensity modulations at the output of MZM 56). When the voltage applied to MZM 56 includes wireless data, MZM 56 may modulate the wireless data onto optical local oscillator signal LO2. If desired, the phase shifting performed at MZM 56 may be used to perform beam forming/steering in addition to or instead of optical phase shifter 80. MZM 56 may receive one or more bias voltages $W_{BIAS}$ (sometimes referred to herein as bias signals $W_{BIAS}$) applied to one or both of arms 58 and 60. Control circuitry 14 (FIG. 1) may provide bias voltage $W_{BIAS}$ with different magnitudes to place MZM 56 into different operating modes (e.g., operating modes that suppress optical carrier signals, operating modes that do not suppress optical carrier signals, etc.).

Intermediate frequency signal path 44 may couple UTC PD 42 to MZM 56 (e.g., arm 60). An amplifier such as low noise amplifier 82 may be interposed on intermediate frequency signal path 44. Intermediate frequency signal path 44 may be used to pass intermediate frequency signals SIGIF from UTC PD 42 to MZM 56. DAC 74 may have an input coupled to up-conversion circuitry, modulator circuitry, and/or baseband circuitry in a transmitter of transceiver circuitry 26. DAC 74 may receive digital data to transmit over antenna 30 and may convert the digital data to the analog domain (e g, as data DAT). DAC 74 may have an output coupled to transmit data path 78. Transmit data path 78 may couple DAC 74 to MZM 56 (e.g., arm 60). Each of the components along signal path 28 may allow the same antenna 30 to both transmit THF signals 32 and receive THF signals 34 (e.g., using the same components along signal path 28), thereby minimizing space and resource consumption within device 10.

LO light sources 70 may produce (emit) optical local oscillator signals LO1 and LO2 (e.g., at different wavelengths that are separated by the wavelength of THF signals 32/34). Optical components 68 may include lenses, waveguides, optical couplers, optical fibers, and/or other optical components that direct the emitted optical local oscillator signals LO1 and LO2 towards optical splitter 54 via optical path 66. Optical splitter 54 may split the optical signals on optical path 66 (e.g., by wavelength) to output optical local oscillator signal LO1 onto optical path 64 while outputting optical local oscillator signal LO2 onto optical path 62.

Control circuitry 14 (FIG. 1) may provide phase control signals CTRL to optical phase shifter 80. Phase control signals CTRL may control optical phase shifter 80 to apply optical phase shift S to the optical local oscillator signal LO1 on optical path 64. Phase shift S may be selected to steer a signal beam of THF signals 32/34 in a desired pointing direction. Optical phase shifter 80 may pass the phase-shifted optical local oscillator signal LO1 (denoted as LO1+S) to optical combiner 52. Signal beam steering is performed in the optical domain (e.g., using optical phase shifter 80) rather than in the THF domain because there are no satisfactory phase shifting circuit components that operate at frequencies as high as the frequencies of THF signals 32 and 34. Optical combiner 52 may receive optical local oscillator signal LO2 over optical path 62. Optical combiner 52 may combine optical local oscillator signals LO1 and LO2 onto optical path 40, which directs the optical local oscillator signals onto UTC PD 42 for use during signal transmission or reception.

During transmission of THF signals 32, DAC 74 may receive digital wireless data (e.g., data packets, frames, symbols, etc.) for transmission over THF signals 32. DAC 74 may convert the digital wireless data to the analog domain and may output (transmit) the data onto transmit data path 78 as data DAT (e.g., for transmission via antenna 30). Power amplifier 76 may amplify data DAT. Transmit data path 78 may pass data DAT to MZM 56 (e.g., arm 60). MZM 56 may modulate data DAT onto optical local oscillator signal LO2 to produce modulated optical local oscillator signal LO2' (e.g., an optical local oscillator signal at the frequency/wavelength of optical local oscillator signal LO2 but that is modulated to include the data identified by data DAT). Optical combiner 52 may combine optical local oscillator signal LO1 with modulated optical local oscillator signal LO2' at optical path 40.

Optical path 40 may illuminate UTC PD 42 with (using) optical local oscillator signal LO1 (e.g., with the phase shift S applied by optical phase shifter 80) and modulated optical local oscillator signal LO2'. Control circuitry 14 (FIG. 1) may apply a control signal $V_{BIAS}$ to UTC PD 42 that configures antenna 30 for the transmission of THF signals 32. UTC PD 42 may convert optical local oscillator signal LO1 and modulated optical local oscillator signal LO2' into antenna currents on radiating element arm(s) 36 at the frequency of THF signals 32 (e.g., while programmed for transmission using control signal $V_{BIAS}$). The antenna currents on radiating element arm(s) 36 may radiate THF signals 32. The frequency of THF signals 32 is given by the difference in frequency between optical local oscillator signal LO1 and modulated optical local oscillator signal LO2'. Control signals $V_{BIAS}$ may control UTC PD 42 to preserve the modulation from modulated optical local oscillator signal LO2' in the radiated THF signals 32. External equipment that receives THF signals 32 will thereby be able to extract data DAT from the THF signals 32 transmitted by antenna 30.

During reception of THF signals 34, MZM 56 does not modulate any data onto optical local oscillator signal LO2. Optical path 40 therefore illuminates UTC PD 42 with optical local oscillator signal LO1 (e.g., with phase shift S) and optical local oscillator signal LO2. Control circuitry 14 (FIG. 1) may apply a control signal $V_{BIAS}$ (e.g., a bias voltage) to UTC PD 42 that configures antenna 30 for the receipt of THF signals 32. UTC PD 42 may use optical local oscillator signals LO1 and LO2 to convert the received THF signals 34 into intermediate frequency signals SIGIF output onto intermediate frequency signal path 44 (e.g., while programmed for reception using bias voltage $V_{BIAS}$) Intermediate frequency signals SIGIF may include the modulated data from the received THF signals 34. Low noise amplifier 82 may amplify intermediate frequency signals SIGIF, which are then provided to MZM 56 (e.g., arm 60). MZM 56 may convert intermediate frequency signals SIGIF to the optical domain as optical signals LOrx (e.g., by modulating the data in intermediate frequency signals SIGIF onto one of the optical local oscillator signals) and may pass the optical signals to optical receiver 72 in optical components 68, as shown by arrow 63 (e.g., via optical paths 62 and 66 or other optical paths). Control circuitry 14 (FIG. 1) may use optical receiver 72 to convert optical signals LOrx to other formats and to recover (demodulate) the data carried by THF signals 34 from the optical signals. In this way, the same antenna 30 and signal path 28 may be used for both the transmission and reception of THF signals while also performing beam steering operations.

The example of FIG. 6 in which intermediate frequency signals SIGIF are converted to the optical domain is merely illustrative. If desired, transceiver circuitry 26 may receive and demodulate intermediate frequency signals SIGIF without first passing the signals to the optical domain. For example, transceiver circuitry 26 may include an analog-to-digital converter (ADC), intermediate frequency signal path 44 may be coupled to an input of the ADC rather than to MZM 56, and the ADC may convert intermediate frequency signals SIGIF to the digital domain. As another example, intermediate frequency signal path 44 may be omitted and control signals $V_{BIAS}$ may control UTC PD 42 to directly sample THF signals 34 with optical local oscillator signals LO1 and LO2 to the optical domain. As an example, UTC PD 42 may use the received THF signals 34 and control signals $V_{BIAS}$ to produce an optical signal on optical path 40. The optical signal may have an optical carrier with sidebands that are separated from the optical carrier by a fixed frequency offset (e.g., 30-100 GHz, 60 GHz, 50-70 GHz, 10-100 GHz, etc.). The sidebands may be used to carry the modulated data from the received THF signals 34. Signal path 28 may direct (propagate) the optical signal produced by UTC PD 42 to optical receiver 72 in optical components 68 (e.g., via optical paths 40, 64, 62, 66, 63, and/or other optical paths). Control circuitry 14 (FIG. 1) may use optical receiver 72 to convert the optical signal to other formats and to recover (demodulate) the data carried by THF signals 34 from the optical signal (e.g., from the sidebands of the optical signal).

If desired, optical components 68 may include clocking circuitry such as one or more electro-optical phase-locked loops. As shown in FIG. 6, optical components 68 may include an electro-optical phase-locked loop (OPLL) circuit such as OPLL 75 (sometimes referred to herein as an opto-electrical phase-locked loop). OPLL 75 may be used to control and clock LO light sources 70 and/or to clock any other desired hardware in device 10 (e.g., OPLL 75 need not be located in transceiver 26 and may, in general, be located elsewhere in device 10). LO light sources 70 may, for example, generate optical LO signals that are phase-locked and frequency-locked with respect to each other using OPLL 75.

Figure 7:
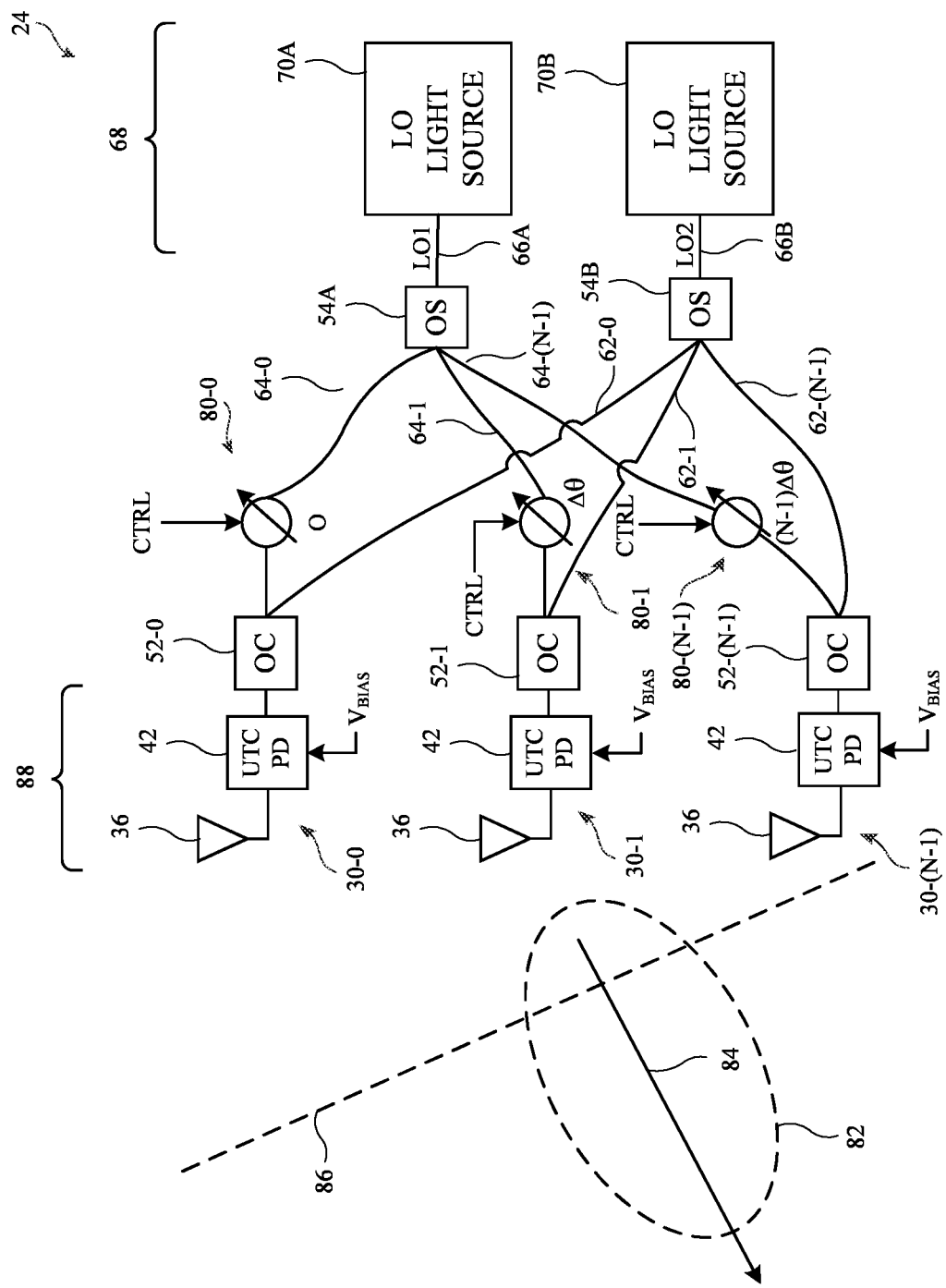
FIG. 7 is a circuit diagram of an illustrative phased antenna array that conveys wireless signals at frequencies greater than about 100 GHz within a corresponding signal beam in accordance with some embodiments.

FIG. 7 is a circuit diagram showing one example of how multiple antennas 30 may be integrated into a phased antenna array 88 that conveys THF signals over a corresponding signal beam. In the example of FIG. 7, MZMs 56, intermediate frequency signal paths 44, data paths 78, and optical receiver 72 of FIG. 6 have been omitted for the sake of clarity. Each of the antennas in phased antenna array 88 may alternatively sample received THF signals directly into the optical domain or may pass intermediate frequency signals SIGIF to ADCs in transceiver circuitry 26.

As shown in FIG. 7, phased antenna array 88 includes N antennas 30 such as a first antenna 30-0, a second antenna 30-1, and an Nth antenna 30-(N−1). Each of the antennas 30 in phased antenna array 88 may be coupled to optical components 68 via a respective optical signal path (e.g., optical signal path 28 of FIG. 6). Each of the N signal paths may include a respective optical combiner 52 coupled to the UTC PD 42 of the corresponding antenna 30 (e.g., the UTC PD 42 in antenna 30-0 may be coupled to optical combiner 52-0, the UTC PD 42 in antenna 30-1 may be coupled to optical combiner 52-1, the UTC PD 42 in antenna 30-(N−1) may be coupled to optical combiner 52-(N−1), etc.). Each of the N signal paths may also include a respective optical path 62 and a respective optical path 64 coupled to the corresponding optical combiner 52 (e.g., optical paths 64-0 and 62-0 may be coupled to optical combiner 52-0, optical paths 64-1 and 62-1 may be coupled to optical combiner 52-1, optical paths 64-(N−1) and 62-(N−1) may be coupled to optical combiner 52-(N−1), etc.).

Optical components 68 may include LO light sources 70 such as a first LO light source 70A and a second LO light source 70B. The optical signal paths for each of the antennas 30 in phased antenna array 88 may share one or more optical splitters 54 such as a first optical splitter 54A and a second optical splitter 54B. LO light source 70A may generate (e.g., produce, emit, transmit, etc.) first optical local oscillator signal LO1 and may provide first optical local oscillator signal LO1 to optical splitter 54A via optical path 66A. Optical splitter 54A may distribute first optical local oscillator signal LO1 to each of the UTC PDs 42 in phased antenna array 88 over optical paths 64 (e.g., optical paths 64-0, 64-1, 64-(N−1), etc.). Similarly, LO light source 70B may generate (e.g., produce, emit, transmit, etc.) second optical local oscillator signal LO2 and may provide second optical local oscillator signal LO2 to optical splitter 54B via optical path 66B. Optical splitter 54B may distribute second optical local oscillator signal LO2 to each of the UTC PDs 42 in phased antenna array 88 over optical paths 62 (e.g., optical paths 62-0, 62-1, 62-(N−1), etc.).

A respective optical phase shifter 80 may be interposed along (on) each optical path 64 (e.g., a first optical phase shifter 80-0 may be interposed along optical path 64-0, a second optical phase shifter 80-1 may be interposed along optical path 64-1, an Nth optical phase shifter 80-(N−1) may be interposed along optical path 64-(N−1), etc.). Each optical phase shifter 80 may receive a control signal CTRL that controls the phase S provided to optical local oscillator signal LO1 by that optical phase shifter (e.g., first optical phase shifter 80-0 may impart an optical phase shift of zero degrees/radians to the optical local oscillator signal LO1 provided to antenna 30-0, second optical phase shifter 80-1 may impart an optical phase shift of Δϕ to the optical local oscillator signal LO1 provided to antenna 30-1, Nth optical phase shifter 80-(N−1) may impart an optical phase shift of (N−1)Δϕ to the optical local oscillator signal LO1 provided to antenna 30-(N−1), etc.). By adjusting the phase S imparted by each of the N optical phase shifters 80, control circuitry 14 (FIG. 1) may control each of the antennas 30 in phased antenna array 88 to transmit THF signals 32 and/or to receive THF signals 34 within a formed signal beam 83. Signal beam 83 may be oriented in a particular beam pointing direction (angle) 84 (e.g., the direction of peak gain of signal beam 83). The THF signals conveyed by phased antenna array 88 may have wavefronts 86 that are orthogonal to beam pointing direction 84. Control circuitry 14 may adjust beam pointing direction 84 over time to point towards external communications equipment or an external object or to point away from external objects, as examples.

Phased antenna array 88 may be operable in an active mode in which the array transmits and/or receives THF signals using optical local oscillator signals LO1 and LO2 (e.g., using phase shifts provided to each antenna element to steer signal beam 83). If desired, phased antenna array 88 may also be operable in a passive mode in which the array does not transmit or receive THF signals. Instead, in the passive mode, phased antenna array 88 may be configured to form a passive reflector that reflects THF signals or other electromagnetic waves incident upon device 10. In the passive mode, the UTC PDs 42 in phased antenna array 88 are not illuminated by optical local oscillator signals LO1 and LO2 and transceiver circuitry 26 performs no modulation/demodulation, mixing, filtering, detection, modulation, and/or amplifying of the incident THF signals.

Devices with processing capabilities include clocking circuitry such as phase-locked loops (PLLs) that generate clock signals. Devices with THF signaling capabilities such as device 10 are particularly sensitive to jitter (deviations from perfect periodicity) and phase noise frequency generation in clock signals (e.g., because the clocking circuitry consumes a relatively high amount of power and chip area for THF frequencies). To minimize clock jitter, processing operations in device 10 may be clocked using an electro-optical PLL (OPLL) such as OPLL 75 of FIG. 6. Examples in which THF communications using transceiver 26 (FIG. 1) are clocked using OPLL 75 are described herein as an example. This is merely illustrative and, in general, OPLL 75 may be used to clock any desired processing operations in device 10 (e.g., high speed digital interface operations, processor computations, sensing, automotive, input/output operations, communications at frequencies lower than 100 GHz such as millimeter/centimeter wave frequencies or frequencies less than 10 GHz, etc.).

Figure 8:
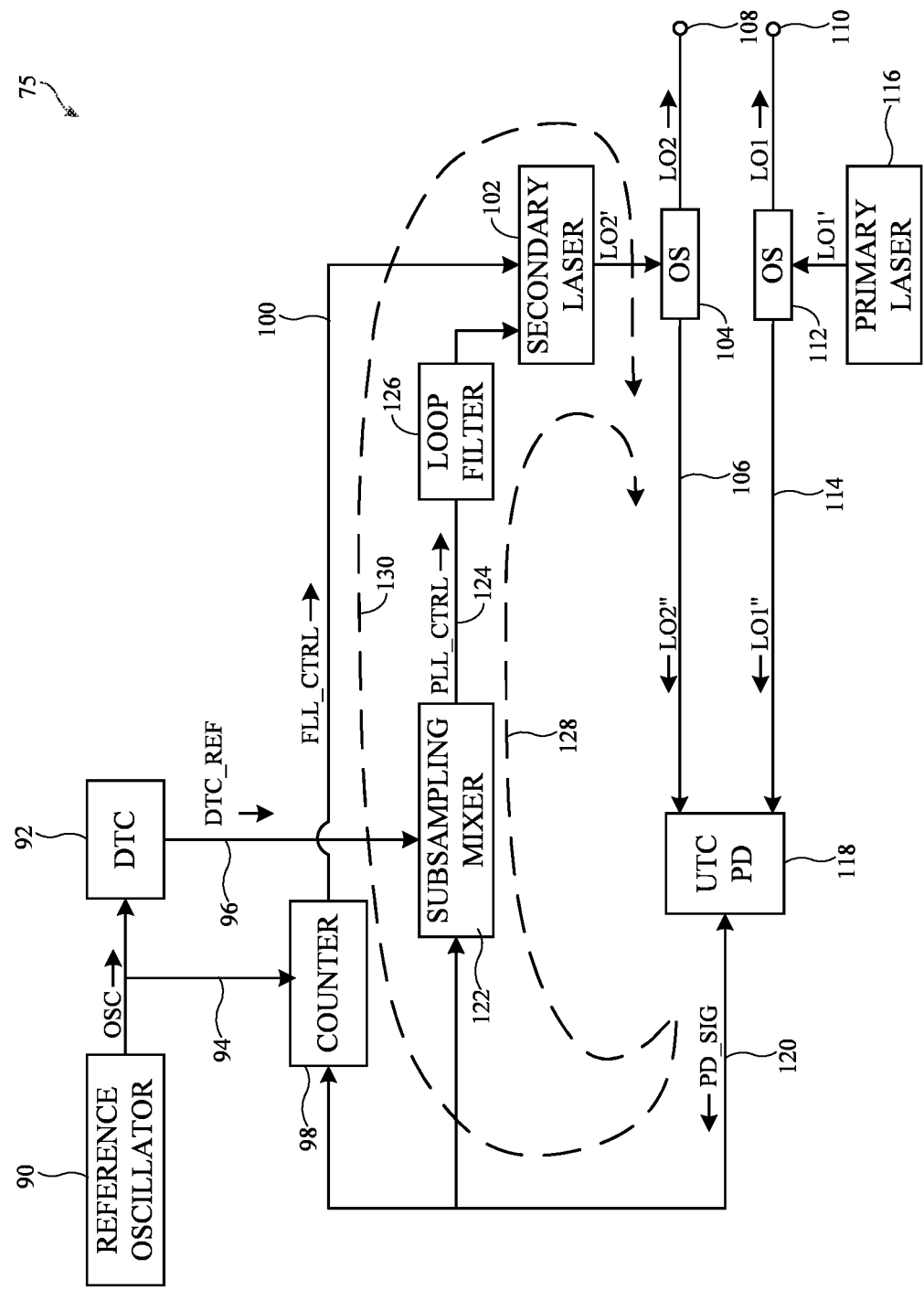
FIG. 8 is a circuit diagram of an illustrative electro-optical phase-locked loop that may use primary and secondary light sources to emit low jitter and low phase noise optical local oscillator signals in accordance with some embodiments.

FIG. 8 is a circuit diagram of OPLL 75. As shown in FIG. 8, OPLL 75 may include an oscillator such as reference oscillator 90, digital-to-time converter circuitry such as digital-to-time converter (DTC) 92, counter circuitry such as counter 98, a mixer such as subsampling mixer 122, filter circuitry such as loop filter 126, a first light source such as primary laser 116, a second light source such as secondary laser 102, optical splitters such as optical splitter (OS) 104 and optical splitter 112, and a photodiode such as UTC PD 118.

Reference oscillator 90 may have an output coupled to the input of DTC 92 over path 94. The output of reference oscillator 90 may also be coupled to an input of counter 98 over path 94. Counter 98 may have an output coupled to a control input of secondary laser 102 over path 100. DTC 92 may have an output coupled to an input of subsampling mixer 122 over path 96. The output of subsampling mixer 122 may be coupled to a control input of secondary laser 102 over path 124. Loop filter 126 may be interposed along path 124 between subsampling mixer 122 and secondary laser 102. Secondary laser 102 may have an output coupled to optical splitter 104. Optical splitter 104 may couple secondary laser 102 to UTC PD 118 over optical path 106 (e.g., one or more optical fibers, waveguides, etc.) and may couple secondary laser 102 to output terminal 108 of OPLL 75.

Primary laser 116 may have an output coupled to optical splitter 112. Optical splitter 112 may couple primary laser 116 to UTC PD 118 over optical path 114 (e.g., one or more optical fibers, waveguides, etc.) and may couple primary laser 116 to output terminal 110 of OPLL 75. If desired, optical paths 106 and 104 may be combined into a single optical path and/or optical splitters 104 and 112 may be combined into a single optical splitter. UTC PD 118 may have an output coupled to an input of counter 98 and coupled to an input of subsampling mixer 122 over path 120 (e.g., one or more radio-frequency transmission lines). Output terminals 108 and 110 may provide optical LO signals that are used to clock other components in device 10. In implementations where OPLL 75 is used to clock THF communications using transceiver 26 (FIG. 1), terminal 108 may be coupled to optical path 62 and terminal 110 may be coupled to optical path 64 of FIG. 6, for example.

OPLL 75 may include a PLL nested within a frequency-locked loop (FLL). For example, UTC PD 118, a portion of path 120, counter 98, path 100, secondary laser 102, optical splitter 104, and optical path 106 may form an FLL as shown by FLL path 130. On the other hand, UTC PD 118, a portion of path 120, sub-sampling mixer 122, path 124, loop filter 126, secondary laser 102, optical splitter 104, and optical path 106 may form a PLL nested within FLL path 130, as shown by PLL path 128. FLL path 130 and PLL path 128 may be feedback paths for secondary laser 102 (e.g., feedback paths that communicably couple the output of secondary laser 102 to the (control) input of secondary laser 102, where subsampling mixer 122 and a phase comparator therein are interposed along the feedback path formed from PLL path 128 and where counter 98 and a comparator therein are interposed along the feedback path formed from FLL path 130). OPLL 75 may produce (e.g., generate, output, emit, etc.) optical local oscillator signal LO1 on output terminal 110 and may produce optical oscillator signal LO2 on output terminal 108. The FLL may be used to coarsely adjust (tune) secondary laser 102 until secondary laser 102 is frequency locked with primary laser 116 (e.g., until optical local oscillator signal LO1 is frequency locked with optical local oscillator signal LO2 such that there is a selected/predetermined stable frequency difference between the two optical local oscillators). The PLL may be used to finely adjust (tune) secondary laser 102 until secondary laser 102 is phase locked with primary laser 116 (e.g., until optical local oscillator signal LO1 is phase locked with optical local oscillator signal LO2). The frequency and phase locked optical local oscillator signals may be used to clock other components in device 10 (e.g., wireless circuitry 24 for the transmission and/or reception of THF signals) with very low jitter and with very low phase noise.

While described herein as lasers, primary laser 116 and secondary laser 102 may be any desired light sources/emitters. Lasers 116 and 102 may form LO light sources 70 of FIG. 7 and/or may respectively form LO light sources 70A and 70B of FIG. 7, for example. Primary laser 116 may sometimes also be referred to as a leader laser whereas secondary laser 102 is sometimes also referred to as a follower laser. Primary laser 116 may emit optical local oscillator signal LO1' at a fixed frequency/wavelength (e.g., primary laser 116 may be a fixed (non-adjustable) laser having a fixed frequency). On the other hand, secondary laser 102 may emit optical local oscillator signal LO2' at an adjustable/programmable frequency/wavelength (e.g., secondary laser 102 may be an adjustable/programmable laser). Control signals received by secondary laser 102 over paths 124 and 100 may be used to adjust/program the frequency of optical local oscillator signal LO2'. The wavelength of optical local oscillator signal LO2' may be offset from the wavelength of optical local oscillator signal LO1' by a selected wavelength offset X (e.g., the frequencies of the THF signals to be transmitted and/or received using optical local oscillator signals LO1 and LO2).

Optical splitter 104 may transmit a first amount of power from optical local oscillator signal LO2' to UTC PD 118 over optical path 106 as optical local oscillator signal LO2''. Optical splitter 104 may transmit a second amount of power from optical local oscillator signal LO2' to output terminal 108 as optical local oscillator signal LO2 (e.g., where the second amount of power is greater than the first amount). As an example, optical splitter 104 may provide 10% of the power of optical local oscillator signal LO2' to UTC PD 118 as optical local oscillator signal LO2" and may provide 90% of the power of optical local oscillator signal LO2' to output terminal 108 as optical local oscillator signal LO2.

At the same time, optical splitter 104 may transmit a first amount of power from optical local oscillator signal LO1' to UTC PD 118 over optical path 114 as optical local oscillator signal LO1". Optical splitter 112 may transmit a second amount of power from optical local oscillator signal LO1' to output terminal 110 as optical local oscillator signal LO1 (e.g., where the second amount of power is greater than the first amount). As an example, optical splitter 112 may provide 10% of the power of optical local oscillator signal LO1' to UTC PD 118 as optical local oscillator signal LO1" and may provide 90% of the power of optical local oscillator signal LO1' to output terminal 110 as optical local oscillator signal LO1. Optical local oscillator signals LO2" and LO1" may be processed by the FLL and the PLL in OPLL 75 to frequency lock and phase lock optical local oscillator signals LO1 and LO2.

Optical path 106 may illuminate UTC PD 118 with optical local oscillator signal LO2". Optical path 114 may illuminate UTC PD 118 with optical local oscillator signal LO1". UTC PD 118 of FIG. 8 need not be a UTC PD and may, in general, be an adjustable/programmable photodiode or component that converts electromagnetic energy (e.g., light or light energy) at optical frequencies (e.g., ultraviolet frequencies, visible frequencies, and/or infrared frequencies) to current at THF frequencies on path 120 (e.g., the same type of component used to produce current on antenna radiating element arms 36 using optical local oscillator signals LO1 and LO2 of FIG. 6).

UTC PD 118 may generate and output photodiode signal PD_SIG on path 120 based on the optical local oscillator signals LO2" and LO1" received over optical paths 106 and 114. Photodiode signal PD_SIG may be at a frequency given by the difference between the frequency of optical local oscillator signal LO2" and the frequency of optical local oscillator signal LO1" (e.g., the frequency of THF signals 32/34 of FIG. 6). Path 120 may convey photodiode signal PD_SIG to counter 98 in FLL loop path 130.

As shown in FIG. 8, reference oscillator 90 may generate reference oscillator signal osc. Reference oscillator 90 may, for example, be a microelectromechanical systems (MEMS) oscillator, a crystal oscillator, or any other fixed or slightly tunable stable oscillator. Reference oscillator signal osc may be produced at a fixed radio frequency such as a frequency between around 5-25 GHz. Reference oscillator 90 may provide reference oscillator signal osc to DTC 92 and counter 98 over path 94.

Counter 98 may measure (e.g., determine, identify, generate, compute, estimate calculate, etc.) the frequency of the photodiode signal PD_SIG received over path 120 using reference oscillator signal osc. For example, counter 98 may count the number of pulses in photodiode signal PD_SIG using reference oscillator signal osc as a reference and then may estimate the frequency of photodiode signal PD_SIG using the counted number of pulses. Counter 98 may also compare the measured frequency of photodiode signal PD_SIG to the expected difference in frequency between optical local oscillator signals LO2" and LO1" (e.g., the expected frequency of THF signals 32/34 of FIG. 6). If the difference between the frequency of photodiode signal PD_SIG and the expected frequency exceeds a threshold value, counter 98 may provide a coarse tuning control signal FLL_CTRL (e.g., a frequency error signal) to secondary laser 102 over path 100 that coarsely adjusts secondary laser 102 to begin outputting optical local oscillator signals LO2' at a different frequency. Coarse tuning control signal FLL_CTRL may coarsely tune the frequency of secondary laser 102 using piezoelectric adjustments, mirror shifts, etc.

Counter 98 may then continue re-measuring photodiode signal PD_SIG and coarsely adjusting secondary laser 102 until the difference between the frequency of photodiode signal PD_SIG and the expected frequency is less than the threshold value (e.g., until the actual frequency produced by secondary laser 102 has settled and is sufficiently close to the desired frequency). Once this occurs, OPLL 75 may lock (freeze) the frequency of secondary laser 102 in place. PLL path 128 may then finely adjust secondary laser 102 to phase lock optical local oscillator signal LO2 to optical local oscillator signal LO1.

Once OPLL 75 has locked the frequency of secondary laser 102 (e.g., once coarse tuning has been completed), subsampling mixer 122 may process photodiode signal PD_SIG. DTC 92 may generate DTC reference signal DTC_REF based on reference oscillator signal osc. DTC 92 may, for example, generate DTC reference signal DTC_REF by programming the edges of a signal pulse to have a selected timing. DTC 92 may also set (program) the frequency, delay, duty cycle, and/or per-clock interval of the signal pulse. DTC 92 is an open loop system and may generate DTC reference signal DTC_REF very rapidly and without using inductive coils, thereby minimizing the chip area required to produce DTC reference signal DTC_REF. DTC 92 may generate signal ramps instead of signal pulses if desired (e.g., DTC reference signal DTC_REF may include signal pulses or signal ramps). DTC 92 may generate DTC reference signal DTC_REF more rapidly than analog components, for example. DTC 92 may generate DTC reference signal DTC_REF at any desired frequency using reference oscillator signal osc. DTC reference signal DTC_REF may be, for example, at a frequency between 5 GHz and 25 GHz.

Subsampling mixer 122 may include a phase detector (e.g., a phase detector that includes digital XOR logic) and/or a frequency detector (e.g., including digital XOR logic and a flip flop). The logic in subsampling mixer 122 (e.g., a phase detector and comparator sometimes referred to herein collectively as a phase comparator) may compare the phase of photodiode signal PD_SIG with the phase of DTC reference signal DTC_REF. In practice, photodiode signal PD_SIG may be at much higher frequencies (e.g., 50-400 GHz) than DTC reference signal DTC_REF (e.g., 5-25 GHz), making phase comparison difficult or impossible. As such, subsampling mixer 122 may subsample photodiode signal PD_SIG to generate a subsampled photodiode signal and may compare the phase of the subsampled photodiode signal to the phase of DTC reference signal DTC_REF (e.g., where the phase of the subsampled photodiode signal is similar to the phase of the original photodiode signal). Subsampling mixer 122 may subsample photodiode signal PD_SIG by only comparing a regularly spaced subset of the samples in photodiode signal PD_SIG to DTC reference signal DTC_REF, for example (e.g., every eighth sample of photodiode signal PD_SIG).

Subsampling mixer 122 may compare the difference between the measured phase of photodiode signal PD_SIG (e.g., the subsampled photodiode signal) and the phase of DTC reference signal DTC_REF to a predetermined threshold value. If the difference exceeds the threshold value, subsampling mixer 122 may provide a fine tuning control signal PLL_CTRL to secondary laser 102 over path 124 that finely adjusts secondary laser 102 to begin outputting optical local oscillator signals LO2' at a different phase. Fine tuning control signal PLL_CTRL may be, for example, an error signal indicative of the phase error in the optical local oscillator produced by secondary laser 102. Loop filter 126 may filter the error signal (e.g., using a 1-3 MHz filter). Fine tuning control signal PLL_CTRL may finely tune the phase of secondary laser 102 by adjusting the capacitance of a varactor in secondary laser 102, for example.

Subsampling mixer 122 may then continue re-measuring photodiode signal PD_SIG and finely adjusting secondary laser 102 until the difference between the phase of photodiode signal PD_SIG (e.g., the subsampled photodiode signal) and the phase of DTC reference signal DTC_REF is less than the threshold value (e.g., until the phase of secondary laser 102 settles on the desired phase exhibited by DTC reference signal DTC_REF). Once this occurs, OPLL 75 may lock (freeze) the phase of secondary laser 102 in place.

The optical local oscillator signals LO1 and LO2 subsequently generated by primary laser 116 and secondary laser 102 may thereafter be frequency locked and phase locked. This may allow optical local oscillator signals LO1 and LO2 to clock other components in device 10 (e.g., to control UTC PDs 42 in wireless circuitry 24 of FIGS. 6 and 7 to transmit and/or receive THF signals) with minimal jitter and minimal phase noise. Generating optical local oscillator signals LO1 and LO2 using a DTC such as DTC 92 in this way may allow for flexibility in reference clock choice and in clock signal processing. For example, DTC 92 may be used for reference clock modulation, fine frequency tuning, frequency dithering, etc. via the PLL loop, where spurious signals generated by the DTC are filtered out by loop filter 126. In contrast with comb frequency generation and/or frequency generation using an MZM, OPLL 75 may allow for minimal spurious frequencies with minimal filtering requirements in the optical domain.

The example of FIG. 8 is merely illustrative. If desired, secondary laser 102 and primary laser 116 may share the same resonating cavity (e.g., secondary laser 102 may utilize a longer or shorter portion of the resonating cavity than primary laser 116 to allow for the difference in wavelength between the optical local oscillator signals). Sharing a common resonating cavity between secondary laser 102 and primary laser 116 may cause secondary laser 102 and primary laser 116 to exhibit very similar thermal effects, thereby helping to tightly lock secondary laser 102 to primary laser 116. Generating optical local oscillator signals LO1 and LO2 in a closed-loop manner in this way may minimize phase noise in optical local oscillator signals LO1 and LO2. The components of OPLL 75 may be implemented in hardware (e.g., one or more digital logic gates, digital circuits, analog circuits, one or more processors, etc.) and/or software (e.g., using logical/computational operations executed by one or more processors).

Figure 9:
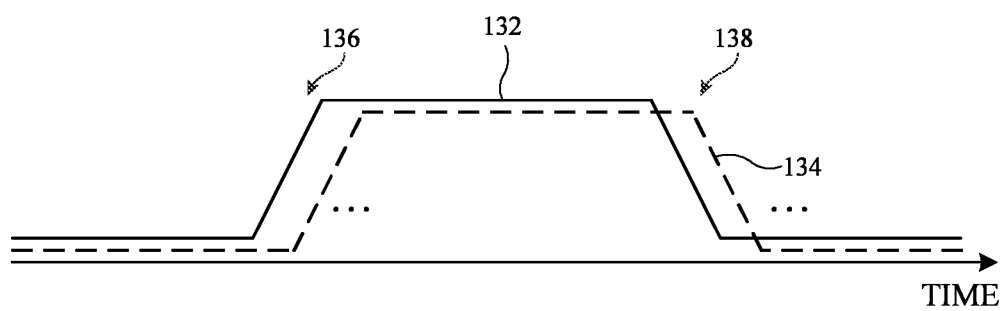
FIG. 9 is a timing diagram showing how an illustrative digital-to-time converter (DTC) may generate a programmable DTC reference signal for an electro-optical phase-locked loop in accordance with some embodiments.

FIG. 9 is a timing diagram of an illustrative signal pulse in DTC reference signal DTC_REF of FIG. 8. Curve 132 shows one signal pulse 132 that may be produced by DTC 92 and curve 134 shows another pulse that may be produced by DTC 92. DTC 92 may be programmable to adjust the timing, slope, and/or spacing of leading edge 136 and/or falling edge 138 of the signal pulse. Such adjustments may be extremely precise (e.g., on the scale of picoseconds). The frequency, delay, and/or duty cycle of the signal pulses may also be precisely programed by DTC 92. The example of FIG. 9 is merely illustrative. Curves 132 and 134 may have other shapes. DTC reference signal DTC_REF may include signal ramps instead of signal pulses if desired.

Figure 10:
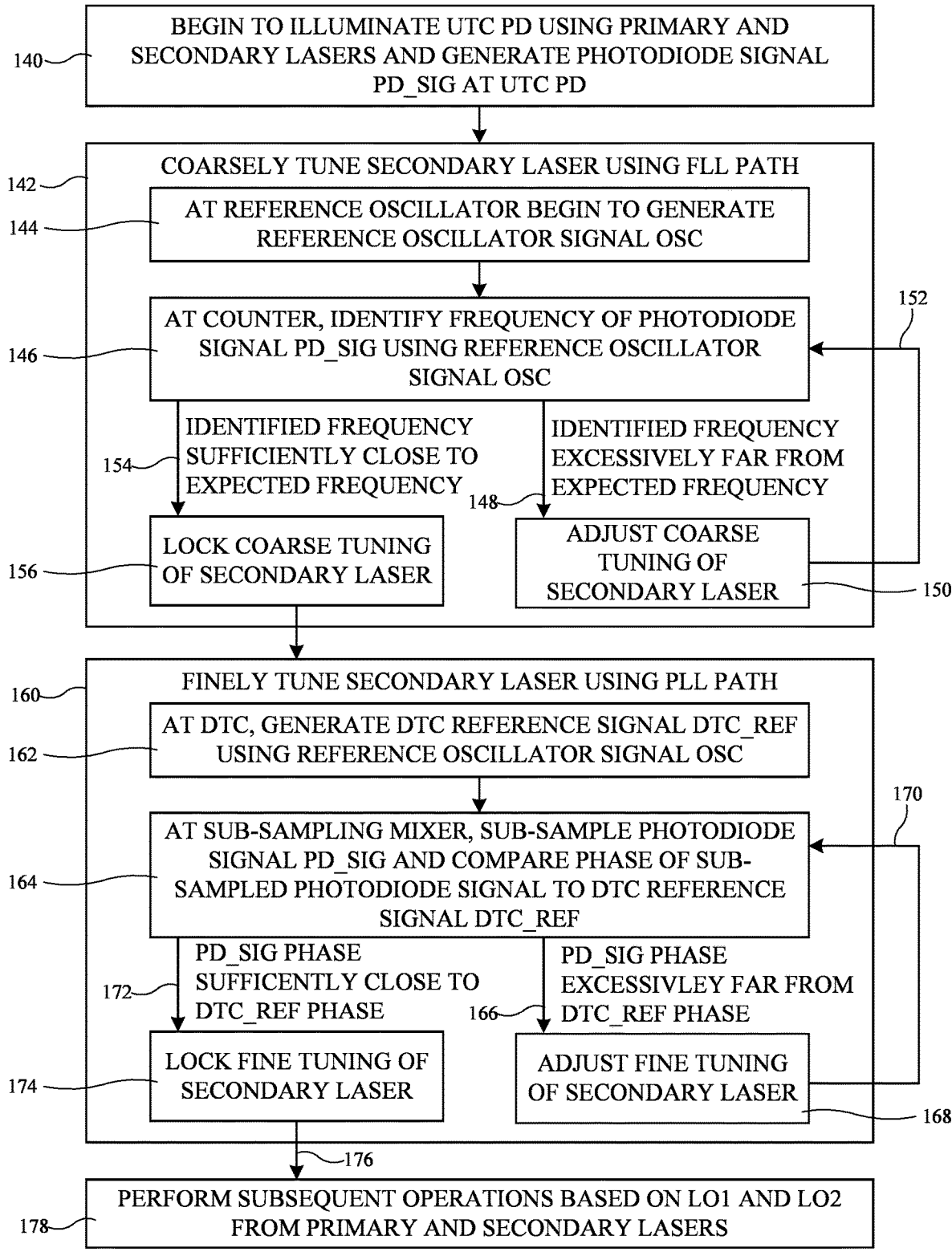
FIG. 10 is a flow chart of illustrative operations involved in using an electro-optical phase-locked loop to emit low jitter and low phase noise optical local oscillator signals in accordance with some embodiments.

FIG. 10 is a flow chart of illustrative operations involved in using OPLL 75 of FIG. 8 to generate optical local oscillator signals LO1 and LO2 (e.g., to clock one or more components in device 10 such as wireless circuitry 24 of FIG. 1). At operation 140 of FIG. 10, secondary laser 102 and primary laser 116 may begin to illuminate UTC PD 118 using optical local oscillator signals LO2" and LO1". UTC PD 188 may generate photodiode signal PD_SIG based on optical local oscillator signals LO2" and LO1".

At operation 142, OPLL 75 may use FLL path 130 to coarsely tune secondary laser 102. For example, at operation 144, reference oscillator 90 may begin to generate reference oscillator signal osc and may provide reference oscillator signal osc to DTC 92 and counter 98.

At operation 146, counter 98 may identify the frequency of photodiode signal PD_SIG using reference oscillator signal osc as a reference. Logic in counter 98 (e.g., a comparator and/or other digital logic) may compare the identified frequency to the predetermined/expected/selected frequency of secondary laser 102. If the identified frequency is excessively far from the expected frequency (e.g., if the difference between the identified frequency and the expected frequency exceeds a threshold), processing may proceed to operation 150 as shown by path 148. At operation 150, counter 98 may use coarse tuning control signal FLL_CTRL to coarsely adjust the frequency of secondary laser 102. Processing may loop back to operation 146 via path 152 until the identified frequency is sufficiently close to the expected frequency.

When the identified frequency is sufficiently close to the expected frequency (e.g., when the difference between the identified frequency and the expected frequency is less than the threshold), processing may proceed from operation 146 to operation 156 as shown by path 154. At operation 156, OPLL 75 may lock the coarse tuning of secondary laser 102 (e.g., may frequency lock secondary laser 102 and optical local oscillator signal LO2'). Processing may subsequently proceed to operation 160 via path 158.

At operation 160, OPLL 75 may use PLL path 128 to finely tune secondary laser 102. For example, at operation 162, DTC 92 may generate DTC reference signal DTC_REF using reference oscillator signal osc. DTC 92 may generate DTC reference signal DTC_REF at a predetermined/selected/desired phase and frequency (e.g., 5-25 GHz). DTC 92 may provide DTC reference signal DTC_REF to sub-sampling mixer 122.

At operation 164, sub-sampling mixer 122 may sub-sample photodiode signal PD_SIG and may compare the phase of the sub-sampled photodiode signal to the phase of DTC reference signal DTC_REF. If the identified phase of the sub-sampled photodiode signal is excessively far from the phase of DTC reference signal DTC_REF (e.g., if the difference between the identified phase and the phase of DTC reference signal DTC_REF exceeds a threshold), processing may proceed to operation 168 as shown by path 166. At operation 168, sub-sampling mixer 122 may use fine tuning control signal PLL_CTRL to finely adjust the phase of secondary laser 102. Processing may loop back to operation 164 via path 170 until the identified phase is sufficiently close to the phase of DTC reference signal DTC_REF.

When the identified phase is sufficiently close to the phase of DTC reference signal DTC_REF (e.g., when the difference between the identified phase and the phase of DTC reference signal DTC_REF is less than the threshold), processing may proceed from operation 164 to operation 174 as shown by path 172. At operation 174, OPLL 75 may lock the fine tuning of secondary laser 102 (e.g., may phase lock secondary laser 102 and optical local oscillator signal LO2'). Processing may subsequently proceed to operation 178 via path 176.

At operation 178, OPLL 75 may clock one or more processing operations in device 10 using optical local oscillator signals LO1 and LO2 (e.g., device 10 may perform subsequent processing operations as clocked by optical local oscillator signals LO1 and LO2). For example, the UTC PDs 42 in device 10 may transmit and/or receive THF signals using the optical local oscillator signals LO1 and LO2 produced by OPLL 75.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users. The optical components described herein (e.g., MZM modulator(s), waveguide(s), phase shifter(s), UTC PD(s), etc.) may be implemented in plasmonics technology if desired.

The methods and operations described above in connection with FIGS. 1-13 (e.g., the operations of FIGS. 10 and 13) may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. An electro-optical phase-locked loop comprising:
    a first light source configured to emit light at a first frequency;
    a second light source configured to emit light at a second frequency that is offset from the first frequency by an offset frequency of at least 50 GHz;
    a feedback path that communicably couples an output of the second light source to an input of the second light source;
    a digital-to-time converter (DTC) configured to generate a reference signal;
    a phase comparator disposed along the feedback path, wherein the phase comparator is configured to adjust the second light source based at least in part on the reference signal; and
    a photodiode having an output coupled to an input of the phase comparator.

2. The electro-optical phase-locked loop of claim 1, further comprising:
    a first optical path that communicably couples an output of the first light source to the photodiode; and
    a second optical path that communicably couples the output of the second light source to the photodiode, wherein the photodiode is configured to generate a photodiode signal at the offset frequency using at least some of the light emitted by the first light source at the first frequency and at least some of the light emitted by the second light source at the second frequency.

3. The electro-optical phase-locked loop of claim 2, wherein the photodiode comprises a uni-travelling-carrier photodiode (UTC PD).

4. The electro-optical phase-locked loop of claim 2, further comprising:
    a first optical splitter that couples the output of the first light source to the first optical path and to a first output terminal of the electro-optical phase-locked loop; and
    a second optical splitter that couples the output of the second light source to the second optical path and to a second output terminal of the electro-optical phase-locked loop.

5. The electro-optical phase-locked loop of claim 2, wherein the phase comparator is configured to adjust the second light source based on a comparison of a phase of the photodiode signal to a phase of the reference signal.

6. The electro-optical phase-locked loop of claim 5, further comprising:
    a subsampling mixer that includes the phase comparator, wherein the subsampling mixer is configured to subsample the photodiode signal to produce a subsampled photodiode signal and the phase comparator is configured to adjust the second light source based on a comparison of a phase of the subsampled photodiode signal to the phase of the reference signal.

7. The electro-optical phase-locked loop of claim 2, further comprising:
    an additional feedback path that communicably couples the output of the second light source to the input of the second light source; and
    a counter disposed along the additional feedback path, wherein the counter is configured to identify the offset frequency based on the photodiode signal and is configured to adjust the second frequency based at least on the identified offset frequency.

8. The electro-optical phase-locked loop of claim 7, further comprising:
    a reference oscillator configured to generate a reference oscillator signal, wherein the DTC is configured to generate the reference signal based on the reference oscillator signal and the counter is configured to estimate the offset frequency based on the photodiode signal and the reference oscillator signal, the reference oscillator signal being at a frequency between 5 GHz and 25 GHz.

9. The electro-optical phase-locked loop of claim 1, further comprising a counter coupled between an output of the photodiode and the second light source.

10. The electro-optical phase-locked loop of claim 1, further comprising:
    a reference oscillator configured to generate a reference oscillator signal, wherein the DTC is configured to generate the reference signal based on the reference oscillator signal;

an additional feedback path that communicably couples the output of the second light source to the input of the second light source; and a counter disposed along the additional feedback path, wherein the counter is configured to identify the offset frequency based at least in part on the reference oscillator signal and is configured to adjust the second frequency based at least on the identified offset frequency.

11. A method of operating an electro-optical phase-locked loop comprising:
    emitting, using a first laser, emitting a first optical local oscillator (LO) signal at a first frequency;
    emitting, using a second laser, a second optical LO signal at a second frequency that is offset from the first frequency by an offset frequency greater than 50 GHz;
    coarsely tuning, using a frequency-locked loop (FLL) path communicably coupled between an output of the second laser and an input of the second laser, the second optical LO signal emitted by the second laser until the second frequency is locked; and
    once the second frequency is locked, finely tuning, using a phase-locked loop (PLL) path communicably coupled between the output of the second laser and the input of the second laser, the second optical LO signal emitted by the second laser until the second optical LO signal is phase-locked with the first optical LO signal.

12. The method of claim 11, further comprising:
    transmitting the first optical LO signal and the second optical LO signal to a photodiode that uses the first optical LO signal and the second optical LO signal to convey wireless signals at the offset frequency over an antenna radiating element.

13. The method of claim 11, further comprising:
    generating, using a photodiode disposed along the FLL path and the PLL path, a photodiode signal at the offset frequency using at least some of the first optical LO signal and at least some of the second optical LO signal.

14. The method of claim 13, further comprising:
    subsampling, using a subsampling mixer disposed along the PLL path, the photodiode signal to generate a subsampled photodiode signal, wherein finely tuning the second optical LO signal includes adjusting, using the subsampling mixer, a phase of the second optical LO signal based at least on a phase of the subsampled photodiode signal.

15. The method of claim 14, further comprising:
    generating, using a digital-to-analog converter (DTC), a reference signal, wherein finely tuning the second optical LO signal includes adjusting, using the subsampling mixer, the phase of the second optical LO based on a comparison of the phase of the subsampled photodiode signal to a phase of the reference signal.

16. The method of claim 13, further comprising:
    identifying, using a counter disposed along the FLL path, the offset frequency using the photodiode signal, wherein coarsely tuning the second optical LO signal comprises adjusting the second frequency based at least on the identified offset frequency.

17. An electronic device comprising:
    an antenna radiating element;
    a first photodiode coupled to the antenna radiating element and configured to convey wireless signals at a frequency greater than 100 GHz using the antenna radiating element, a first optical local oscillator (LO) signal, and a second optical LO signal; and
    optical components configured to generate the first optical LO signal and the second optical LO signal, the optical components including
      a first laser configured to emit the first optical LO signal,
      a second laser configured to emit the second optical LO signal,
      a second photodiode configured to generate a photodiode signal based on the first optical LO signal and the second optical LO signal, and
      a subsampling mixer configured to generate a subsampled photodiode signal based on the photodiode signal and configured to tune the second laser based at least in part on a phase of the subsampled photodiode signal.

18. The electronic device of claim 17, further comprising:
    a counter configured to identify a frequency of the photodiode signal and configured to tune the second laser based at least in part on the identified frequency of the photodiode signal.

19. The electronic device of claim 17, wherein the first laser comprises a first portion of a resonant cavity and the second laser comprises a second portion of the resonant cavity that is longer than the first portion.

20. The electronic device of claim 17, wherein the first photodiode comprises a uni-travelling-carrier photodiode (UTC PD).

* * * * *